(12) United States Patent
Yin et al.

(10) Patent No.: US 11,747,451 B2
(45) Date of Patent: Sep. 5, 2023

(54) LIGHT SENSOR AND CALIBRATION METHOD THEREOF

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 210 days.

(21) Appl. No.: 17/369,982

(22) Filed: Jul. 8, 2021

(65) Prior Publication Data

US 2022/0011159 A1    Jan. 13, 2022

Related U.S. Application Data

(60) Provisional application No. 63/058,502, filed on Jul. 30, 2020, provisional application No. 63/050,120, filed on Jul. 10, 2020.

(51) Int. Cl.
*G01S 7/4865*     (2020.01)
*G01S 7/481*      (2006.01)
(Continued)

(52) U.S. Cl.
CPC .............. *G01S 7/4865* (2013.01); *G01J 1/44* (2013.01); *G01S 7/484* (2013.01); *G01S 7/4814* (2013.01);
(Continued)

(58) Field of Classification Search
CPC .... G01S 7/4865; G01S 7/4814; G01S 7/4816; G01S 7/484; G01S 7/4863; G01S 7/4861;
(Continued)

(56) References Cited

U.S. PATENT DOCUMENTS

2013/0279639 A1\* 10/2013 Perot .................... G01V 5/0008
                                                    376/154
2017/0016998 A1\*  1/2017 Shahar .................... G01T 1/161
(Continued)

*Primary Examiner* — David P Porta
*Assistant Examiner* — Casey Bryant
(74) *Attorney, Agent, or Firm* — JCIPRNET

(57) ABSTRACT

A light sensor and its calibration method are provided. The light sensor includes a light source, a sensing sub-pixel, and a control circuit. The light source emits a sensing light beam. The sensing sub-pixel includes a diode, a quenching resistor, and a time-to-digital converter. The diode has a first terminal coupled to an operation voltage. The quenching resistor is coupled between a second terminal of the diode and a ground voltage. The time-to-digital converter is coupled to the second terminal of the diode. The control circuit is coupled to the sensing sub-pixel and calibrates a sensing sensitivity of the sensing sub-pixel according to at least one of a photon detection probability, an internal gain value, and a resistance value of the quenching resistor corresponding to the diode of the sensing sub-pixel, so that the sensing sub-pixel generates a single-photon avalanche diode sensing signal only when receiving the sensing light beam.

18 Claims, 7 Drawing Sheets

(51) Int. Cl.
- *G01S 17/10* (2020.01)
- *G01S 7/484* (2006.01)
- *G01J 1/44* (2006.01)
- *G01S 17/14* (2020.01)
- *G01S 7/4863* (2020.01)
- *G04F 10/00* (2006.01)
- *H01L 27/144* (2006.01)
- *H01L 31/107* (2006.01)
- *H01L 27/146* (2006.01)

(52) U.S. Cl.
CPC .......... *G01S 7/4816* (2013.01); *G01S 7/4863* (2013.01); *G01S 17/10* (2013.01); *G01S 17/14* (2020.01); *G04F 10/005* (2013.01); *H01L 27/1446* (2013.01); *H01L 27/14609* (2013.01); *H01L 31/107* (2013.01); *G01J 2001/442* (2013.01); *G01J 2001/444* (2013.01); *G01J 2001/448* (2013.01); *G01J 2001/4466* (2013.01)

(58) Field of Classification Search
CPC ............... G01S 7/4868; H01L 27/1446; H01L 27/14609
See application file for complete search history.

(56) References Cited

U.S. PATENT DOCUMENTS

| | | |
|---|---|---|
| 2017/0179173 A1* | 6/2017 | Mandai ............ H01L 27/14609 |
| 2019/0025440 A1* | 1/2019 | Steadman Booker ...................... G01T 1/2928 |
| 2020/0018642 A1* | 1/2020 | Yin ........................ G01S 7/4865 |
| 2020/0182988 A1* | 6/2020 | Pau ........................ G01S 7/4815 |
| 2020/0284884 A1* | 9/2020 | Henderson ............ G01S 7/4865 |

\* cited by examiner

LIGHT SENSOR AND CALIBRATION METHOD THEREOF

CROSS-REFERENCE TO RELATED APPLICATION

This application claims the priority benefit of U.S. provisional application Ser. No. 63/050,120, filed on Jul. 10, 2020, and U.S. provisional application Ser. No. 63/058,502, filed on Jul. 30, 2020. The entirety of each of the above-mentioned patent applications is hereby incorporated by reference and made a part of this specification.

BACKGROUND

Technical Field

The disclosure relates to a sensing technology, and particularly relates to a light sensor and a calibration method thereof.

Description of Related Art

At present, high-sensitivity ranging sensors are in demand in various application fields, such as a medical field or an automotive field. In particular, light sensors that may be used to sense extremely weak light beams comply with one of the current design trends of major sensors. Therefore, how to provide and implement a light sensor with high precision and high reliability and capable of effectively sensing the extremely weak light beam is described in several embodiments below.

SUMMARY

The disclosure is directed to a light sensor and a calibration method thereof, which are adapted to calibrate setting parameters in association with a sensing sub-pixel of the light sensor, so that the light sensor may achieve a single-photon avalanche diode sensing function with high reliability.

An embodiment of the disclosure provides a light sensor including a light source, a sensing sub-pixel, and a control circuit. The light source is configured to emit sensing light beam. The sensing sub-pixel includes a diode, a quenching resistor, and a time-to-digital converter. The diode has a first terminal coupled to an operation voltage. The quenching resistor is coupled between a second terminal of the diode and a ground voltage. The time-to-digital converter is coupled to the second terminal of the diode. The control circuit is coupled to the sensing sub-pixel and is configured to calibrate a sensing sensitivity of the sensing sub-pixel according to at least one of a photon detection probability, an internal gain value, and a resistance value of the quenching resistor corresponding to the diode of the sensing sub-pixel, so that the sensing sub-pixel generates a single-photon avalanche diode sensing signal only when receiving the sensing light beam.

An embodiment of the disclosure provides a calibration method adapted to a light sensor. The light sensor includes a light source, a sensing sub-pixel, and a control circuit. The sensing sub-pixel includes a diode, a quenching resistor, and a time-to-digital converter. The calibration method includes following steps: turning off the light source through the control circuit; adjusting a sensing sensitivity of each sensing sub-pixel to a maximum value through the control circuit, operating the sensing sub-pixel to perform sensing through the control circuit, and determining whether the sensing sub-pixel produces a single-photon avalanche diode sensing signal; when the sensing sub-pixel produces the single-photon avalanche diode sensing signal, calibrating the sensing sensitivity of the sensing sub-pixel according to at least one of a photon detection probability, an internal gain value, and a resistance value of the quenching resistor corresponding to the diode of the sensing sub-pixel; turning on the light source through the control circuit; and operating the sensing sub-pixel to perform sensing through the control circuit, and determining whether the sensing sub-pixel produces the single-photon avalanche diode sensing signal.

Based on the above description, the light sensor and the calibration method thereof provided in one or more embodiments of the disclosure may be applied to effectively calibrate the sensing sub-pixel, so that the sensing sub-pixel generates the single-photon avalanche diode sensing signal only when receiving the sensing light beam emitted by the light source, whereby the single-photon avalanche diode sensing function with high reliability is achieved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
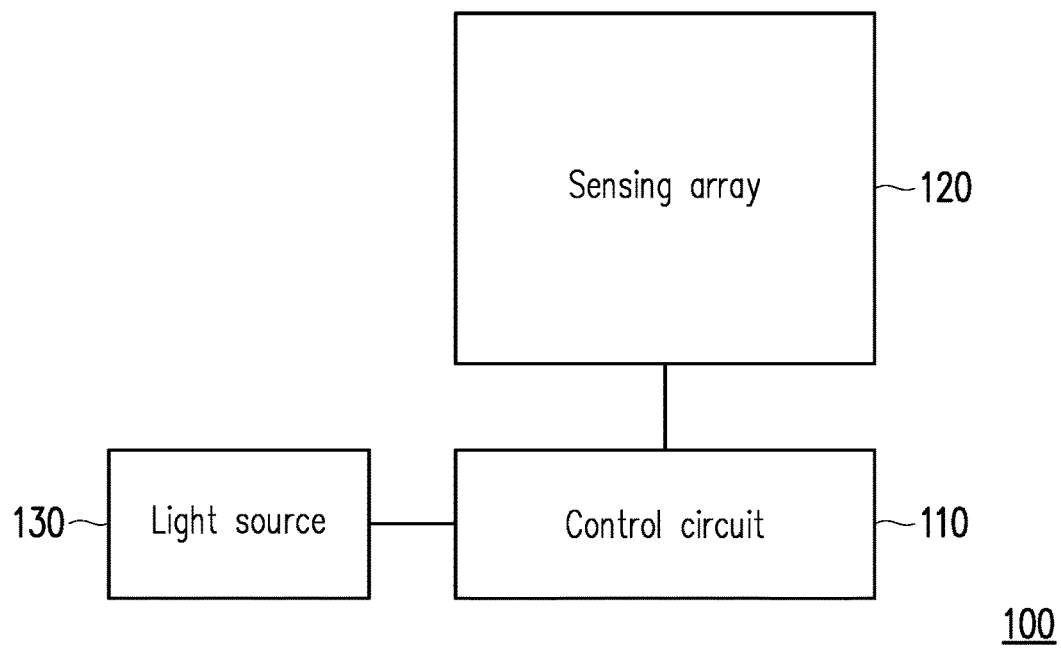
FIG. 1 is a schematic structural diagram of a light sensor according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
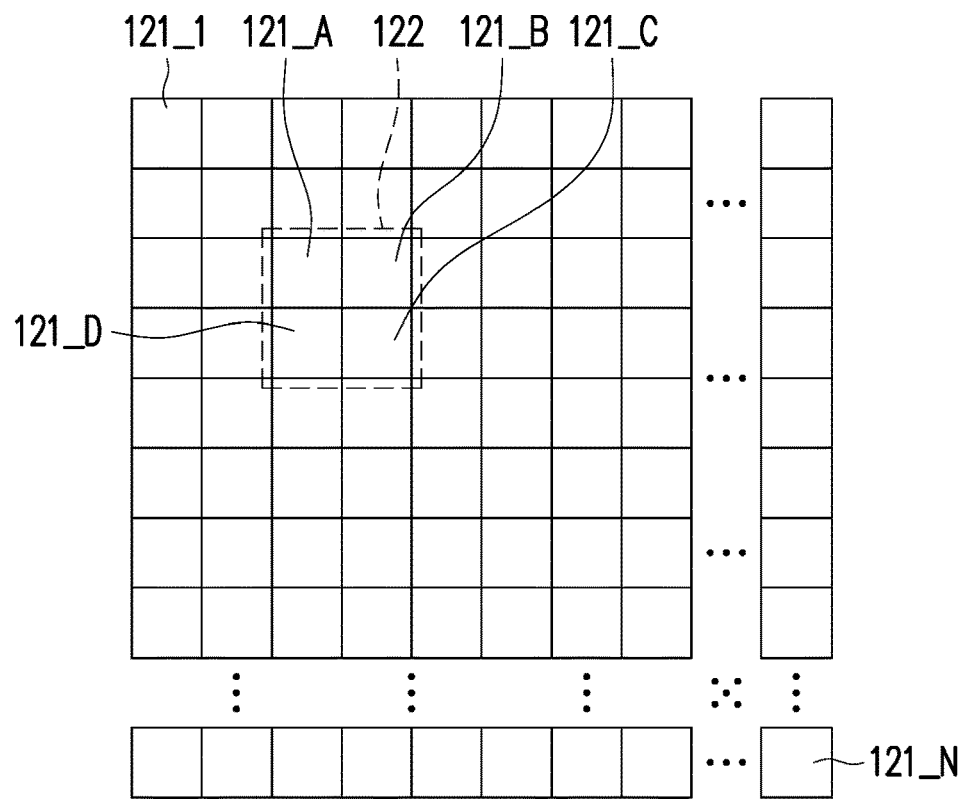
FIG. 2 is a schematic diagram of a sensing array according to an embodiment of the disclosure.

FIG. 1 is a schematic structural diagram of a light sensor according to an embodiment of the disclosure. FIG. 2 is a schematic diagram of a sensing array according to an embodiment of the disclosure. With reference to FIG. 1 and FIG. 2, the light sensor 100 includes a control circuit 110, a sensing array 120, and a light source 130. The control circuit 110 is coupled to the sensing array 120 and the light source 130. The sensing array 120 includes a plurality of sensing sub-pixels 121_1-121_N, where N is a positive integer. Each of the sensing sub-pixels 121_1-121_N includes at least one diode (a photodiode). The diode may be a p-n junction diode. In the embodiment, the control circuit 110 may control the sensing array 120 to operate the diodes in the sensing sub-pixels 121_1-121_N in a Geiger mode or an avalanche linear mode to perform a light sensing operation.

In the embodiment, the light source 130 may be an infrared laser light source, but the disclosure is not limited thereto. In other embodiments of the disclosure, the light source 130 may be a visible light source or an invisible light source. In the embodiment, the control circuit 110 may respectively operate the plurality of diodes of the sensing sub-pixels 121_1-121_N to be in a single-photon avalanche diode (SPAD) state of the Geiger mode or the avalanche linear mode to sense sensing light beam emitted by the light source 130, so as to achieve a ranging sensing function with low light quantity and high sensing sensitivity characteristics.

In the embodiment, the control circuit 110 may be, for example, an internal circuit or a chip of the light sensor, and includes a digital circuit element and/or an analog circuit element. The control circuit 110 may control an operation mode of the diodes in the sensing sub-pixels 121_1-121_N and/or an operation mode of the sensing sub-pixels 121_1-121_N by changing a bias voltage of the diodes in the sensing sub-pixels 121_1-121_N and/or a control voltage of a plurality of transistors. The control circuit 110 may control the light source 130 to emit a sensing light beam, and may perform related signal processing and sensing data calculations on sensing signals output by the sensing sub-pixels 121_1-121_N. In some other embodiments of the disclosure, the control circuit 110 may also be, for example, an external circuit or chip of the light sensor, such as a central processing unit (CPU), a microprocessor control unit (MCU) or a field programmable gate array (FPGA), etc., of a certain terminal device, or other similar processing circuits or control circuits, but the disclosure is not limited thereto.

Figure 3:
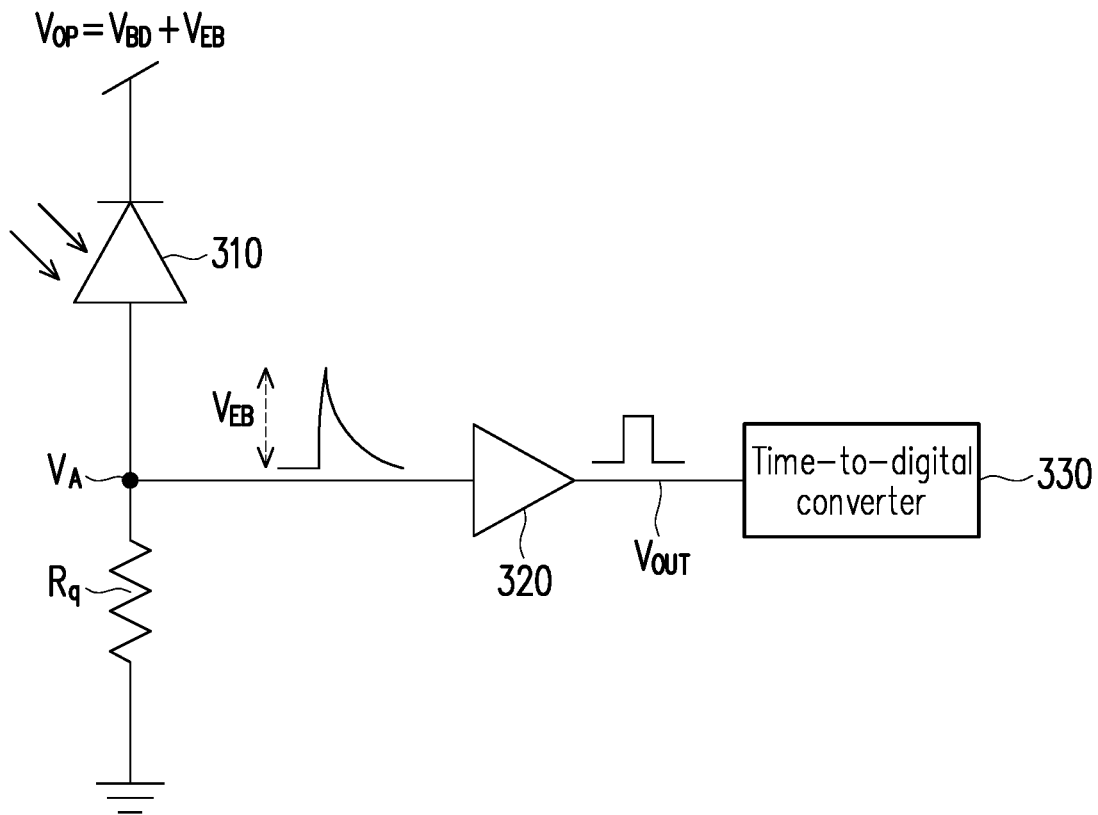
FIG. 3 is a schematic circuit diagram of a sensing sub-pixel according to an embodiment of the disclosure.

FIG. 3 is a schematic circuit diagram of a sensing sub-pixel according to an embodiment of the disclosure. With reference to FIG. 3, a sensing sub-pixel 300 of the embodiment may be applied to the sensing sub-pixels described in various embodiments of the disclosure. In the embodiment, the sensing sub-pixel 300 includes a diode 310 and a quenching resistor Rq, and the control circuit (for example, the control circuit 110 of FIG. 1) of the light sensor may include an amplifier 320 and a time-to-digital converter 330. The time-to-digital converter 330 includes a counting circuit 331. In the embodiment, a first end of the diode 310 is coupled to an operating voltage $V_{OP}$ ($V_{OP}=V_{BD}+V_{EB}$), where $V_{BD}$ is a breakdown voltage, and $V_{EB}$ is an excess bias voltage. The quenching resistor Rq is coupled between a second end of the diode 310 and a ground terminal voltage. There is a node voltage $V_A$ between the quenching resistor Rq and the second end of the diode 310. An input terminal of the amplifier 320 is coupled to the second end of the diode 310. An output terminal of the amplifier 320 is coupled to the time-to-digital converter 330. In the embodiment, the control circuit (such as the control circuit 110 in FIG. 1) may control a bias voltage of the diode 310, so that the diode 310 operates in the Geiger mode or the avalanche linear mode to receive ranging light emitted by a specific light source (such as the light source 130 in FIG. 1). In this regard, when the diode 310 senses a single-photon or several photons (minor photons) of the ranging light, the input terminal of the amplifier 320 may receive a sensing signal provided by the diode 310, where the sensing signal may be a single-photon sensing signal. In addition, the output terminal of the amplifier 320 may output an amplified sensing signal $V_{OUT}$ to the time-to-digital converter 330, where the amplified sensing signal $V_{OUT}$ may be, for example, a square wave pulse signal. In the embodiment, the control circuit (for example, the control circuit 110 of FIG. 1) may control the bias voltage of the diode 310, so that the diode 310 operates in the Geiger mode or the avalanche linear mode to receive the sensing light beam emitted by the specific light source (for example, the light source 130 in FIG. 1).

Figure 4:
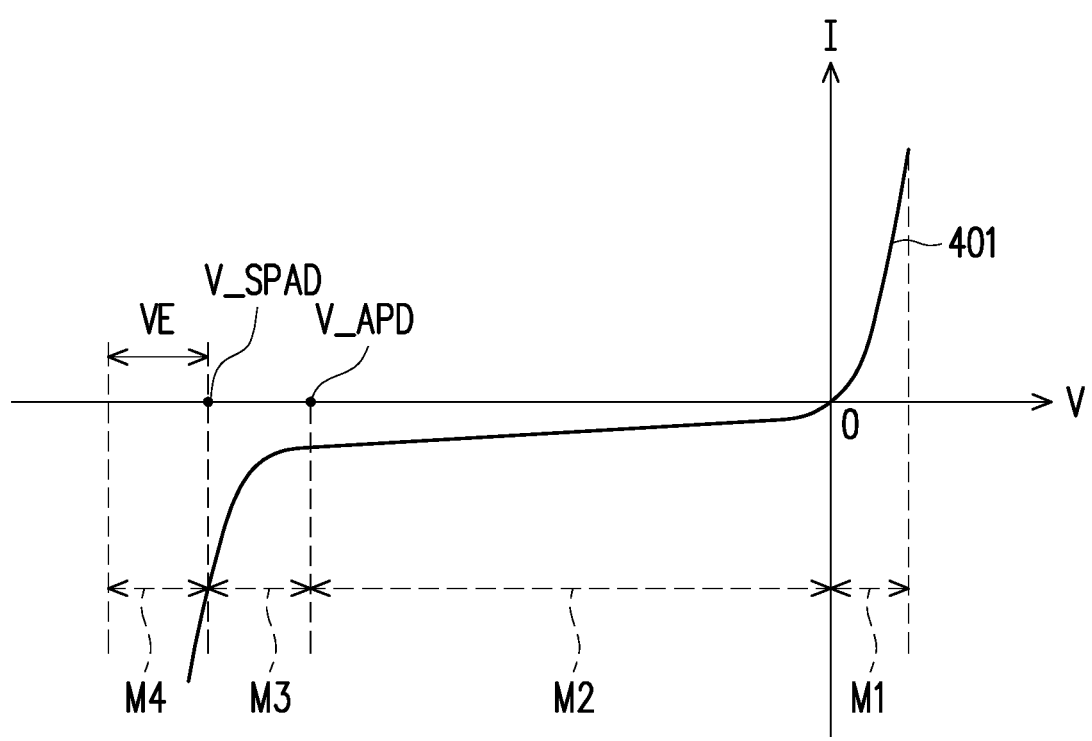
FIG. 4 is a characteristic curve diagram of a diode according to an embodiment of the disclosure.
Figure 5:
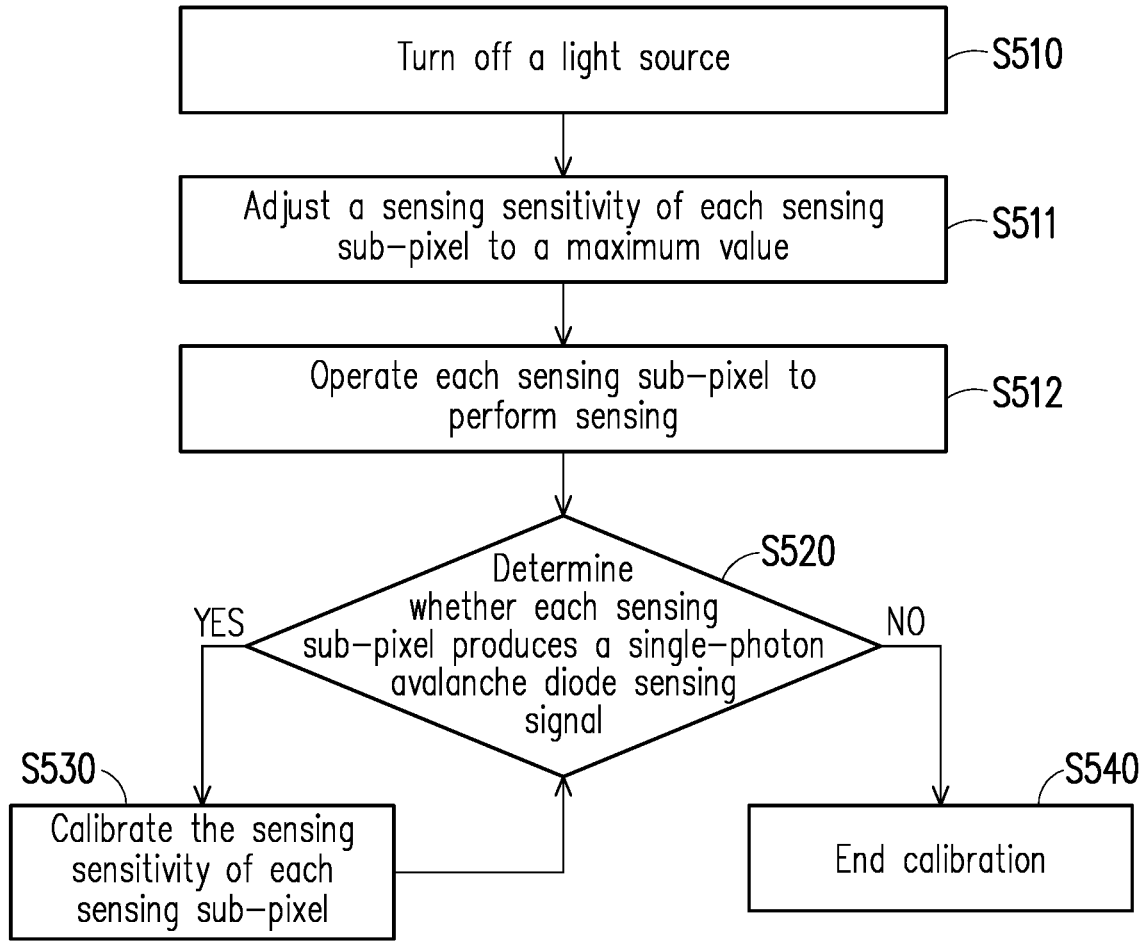
FIG. 5 is a flowchart of a calibration method according to an embodiment of the disclosure.

FIG. 4 is a characteristic curve diagram of a diode according to an embodiment of the disclosure. FIG. 5 is a flowchart of a calibration method according to an embodiment of the disclosure. With reference to FIG. 1, FIG. 2, FIG. 4, and FIG. 5, the light sensor 100 of FIG. 1 may execute following steps S510-S550 to calibrate the sensing sub-pixels 121_1-121_N. It should be noted that the diode of the sensing sub-pixel in the embodiment may have a characteristic curve 401 as shown in FIG. 4. A horizontal axis of FIG. 4 represents a bias voltage V of the diode, and a vertical axis represents a current I of the diode under the corresponding bias voltage. When the bias voltage V of the diode is greater than 0 (shown as a voltage range M1 in FIG. 4), the diode may be operated in a solar cell mode. When the bias voltage V of the diode is between 0 and an avalanche voltage V_APD (shown as a voltage range M2 in FIG. 4), the diode may be operated in a photodiode mode. When the bias voltage V of the diode is between the avalanche voltage V_APD and a breakdown voltage V_SPAD (shown as a voltage range M3 in FIG. 4), the diode may be operated in an avalanche linear mode. When the bias voltage V of the diode is less than the breakdown voltage V_SPAD (shown as a voltage range M4 in FIG. 4), the diode may be operated in the Geiger mode.

In the embodiment, the control circuit 110 controls the bias voltages of the plurality of diodes of the sensing sub-pixels 121_1-121_N, so that the plurality of diodes are operated in the Geiger mode or the avalanche linear mode to receive the sensing light beam emitted by the light source 130. In step S510, the control circuit 110 turns off the light source 130. In step S511, the control circuit 110 adjusts a sensing sensitivity of each of the sensing sub-pixels 121_1-121_N to the highest. In step S512, the control circuit 110 operates each of the sensing sub-pixels 121_1-121_N to perform sensing. In step S520, the control circuit 110 determines whether each of the sensing sub-pixels 121_1-121_N produces a single-photon avalanche diode sensing signal. If not, in step S540, the control circuit 110 ends the calibration. If yes, in step S530, the control circuit 110 calibrates the sensing sensitivity of each of the sensing sub-pixels. In this regard, the control circuit 110 may calibrate the sensing sensitivity of each of the sensing sub-pixels 121_1-121_N according to at least one of a photon detection probability, an internal gain value, and a resistance value of the quenching resistor corresponding to the diode of each of the sensing sub-pixels 121_1-121_N. In addition, the control circuit 110 may execute steps S520 and S530 in a loop, until the step S520, when the control circuit 110 determines that each of the sensing sub-pixels 121_1-121_N does not produce the single-photon avalanche diode sensing signal, the control circuit 110 ends the calibration. In other words, the control circuit 110 of the disclosure may first determine whether each of the sensing sub-pixels 121_1-121_N to 121_N has misjudgment when the light source 130 does not emit the sensing light beam, so as to determine whether to correct the sensing sensitivity of each of the sensing sub-pixels.

To be specific, the following description is made with reference of the sensing sub-pixel 300 of FIG. 3. The single-photon avalanche diode sensing mechanism of the diode 310 of the embodiment may be pre-designed as when the diode 310 receives one photon of the sensing light beam reflected by a sensing object, the diode may generate a large current to trigger the quenching circuit, and input the sensing signal to the time-to-digital converter 330, so that the time-to-digital converter 330 outputs corresponding sensing time information. Therefore, the control circuit 110 may perform calculation according to an emission time of the sensing light beam and the above-mentioned sensing time information to obtain a time-of-flight sensing result. However, the diode 310 may generate a false sensing signal due to receiving multiple photons of background light or ambient light when the light source 130 does not emit the sensing light beam. Therefore, the control circuit 110 may calibrate the sensing sensitivity of each of the sensing sub-pixels 121_1-121_N in FIG. 2 (to calibrate one-by-one) by executing at least one of the following correction means. It should be noted that the sensing sensitivity of each of the sensing sub-pixel 121_1-121_N may be different due to variation of a manufacturing process, so that one-by-one calibration is needed.

In a first calibration means (adapted to the diode 310 operated in the Geiger mode), the control circuit 110 may adjust an excess bias (Vex) voltage VE of the diode 310 of the sensing sub-pixel 300 operated in the Geiger mode to change a photon detection probability (PDP) of the diode 310 of the sensing sub-pixel 300, i.e., a receiving probability of photons, to calibrate the sensing sensitivity of the light sensor 100. As shown in FIG. 4, the excess bias voltage VE represents a voltage range M4 (an operation range) that is smaller than the breakdown voltage V_SPAD. The control circuit 110 may reduce the excess bias voltage VE to reduce the photon detection probability of the diode 310. In other words, after the photon detection probability of the diode 310 is reduced, in terms of probability, the diode 310 needs to receive more than N photons (for example, an intensity of the ambient light corresponding to five photons, then N=5) for being turned on to generate a sensing signal, where N is a positive integer. For example, after the photon detection probability of the diode 310 is reduced, in terms of probability, the diode 310 may receive one photon in every six photons to trigger the quenching circuit and input the sensing signal to the time-to-digital converter 330. In this regard, the control circuit 110 may, for example, execute a stepwise adjustment mechanism of steps S520 and S530 to gradually adjust the excess bias voltage VE (stepwise adjustment of the operation range of the diode 310) according to a preset adjustment voltage value (for example, 0.1V of step-by-step adjustment). Therefore, the sensing sensitivity of the sensing sub-pixel 300 may be effectively reduced, and the diode 310 of the sensing sub-pixel 300 may be prevented from generating a false sensing signal when the light source 130 does not emit the sensing light beam.

In a second calibration means (adapted to the diode 310 operated in the Geiger mode or the avalanche linear mode), the control circuit 110 may change an internal gain value of the diode 310 of the sensing sub-pixel 300 to calibrate the sensing sensitivity of the light sensor 100 by adjusting the excess bias voltage VE of the diode 310 of the sensing sub-pixel 300 operated in the Geiger mode or the bias voltage of the diode 310 operated in the avalanche linear mode. In this regard, since the internal gain value of the diode 310 is increased as the bias voltage increases, and is decreased as the bias voltage decreases, the control circuit 110 may reduce the internal gain value by means of reducing the excess bias voltage VE or the bias voltage of the diode 310 operated in the avalanche linear mode. If the internal gain value of the diode 310 is decreased, a current generated by one photon in the diode 310 is decreased. In other words, after the internal gain value of the diode 310 is decreased, the diode 310 needs to receive more than N photons (for example, the intensity of the ambient light corresponding to five photons, then N=5) before generating a large enough current to trigger the quenching circuit, and inputting the sensing signal to the time-to-digital converter 330 to generate the sensing signal. For example, after the internal gain value of the diode 310 is decreased, when the diode 310 receives six photons of the sensing light beam, the diode 310 may generate a large enough current to trigger the quenching circuit and input the sensing signal to the time-to-digital converter. In this regard, the control circuit 110 may, for example, perform the stepwise adjustment mechanism of steps S520 and S530 to gradually adjust the excess bias voltage VE or the bias voltage operated in the avalanche linear mode (stepwise adjustment of the operation range of the diode 310) according to the preset adjustment voltage value (for example, 0.1V of step-by-step adjustment). Therefore, the sensing sensitivity of the sensing sub-pixel 300 may be effectively reduced, and the diode 310 of the sensing sub-pixel 300 may be prevented from generating a false sensing signal when the light source 130 does not emit the sensing light beam.

In a third calibration means (adapted to the diode 310 operated in the Geiger mode or the avalanche linear mode), the control circuit 110 may calibrate the sensing sensitivity of the light sensor 100 by adjusting the resistance value of the quenching resistor Rq (the quenching resistance Rq may be a variable resistor) of the sensing sub-pixel 300. In this regard, if the resistance value of the quenching resistor Rq is reduced, a node voltage $V_A$ (V=IR) generated by the diode 310 when receiving one photon is also reduced. In other words, after the resistance value of the quenching resistor Rq is reduced, the diode 310 needs to receive more than N photons (for example, the intensity of the ambient light corresponding to five photons, then N=5) before triggering the quenching circuit, and inputting the sensing signal to the time-to-digital converter 330 to generate the sensing signal. For example, after the resistance value of the quenching resistor Rq is reduced, when the diode 310 receives six photons of the sensing light beam, the node voltage $V_A$ generated by the diode 310 according to the six photons is large enough to trigger the quenching circuit and input the sensing signal to the time-to-digital converter 330. In this regard, the control circuit 110 may, for example, execute the stepwise adjustment mechanism of steps S520 and S530 to gradually reduce the resistance value of the quenching resistor Rq according to the preset adjustment resistance value. Therefore, the sensing sensitivity of the sensing sub-pixel 300 may be effectively reduced, and the diode 310 of the sensing sub-pixel 300 may be prevented from generating a false sensing signal when the light source 130 does not emit the sensing light beam.

In a fourth calibration means (adapted to the diode 310 operated in the Geiger mode or the avalanche linear mode), in the above step S530, alternatively, the control circuit 110 may adjust a co-incidence working number of the sensing sub-pixel 300 and at least one another sensing sub-pixel to correspondingly calibrate an overall sensing sensitivity of the light sensor 100. In this regard, it should be noted that the control circuit 110 may determine whether a plurality of diodes of the sensing sub-pixel 300 and the at least one another sensing sub-pixel synchronously generate a plurality of sensing currents in an exposure time interval, so as to confirm whether the plurality of diodes of the sensing sub-pixel 300 and the at least one another sensing sub-pixel sense light. In other words, the control circuit 110 may, for example, set every several sensing sub-pixel in the sensing sub-pixels 121_1-121_N of the embodiment as a sensing pixel (which is also referred to as a macro-pixel). For example, with reference to FIG. 2, the four sensing sub-pixels 121_A-121_D may serve as one sensing pixel 122, where A-D are positive integers and less than or equal to N. The control circuit 110 may determine whether the sensing sub-pixels 121_A-121_D respectively sense one or more photons in a corresponding same exposure time interval to synchronously generate a plurality of sensing currents to serve as a pixel sensing result. For example, the control circuit 110 may take a distance sensing result (a time difference or a distance value) of the sensing sub-pixels 121_A-121_D as a pixel sensing result. Therefore, the sensing sub-pixels 121_A-121_D of the sensing pixel 122 need to respectively receive one photon of the sensing light beam before the control circuit 110 takes the plurality of sensing currents of the sensing sub-pixels 121_A-121_D as one pixel sensing result. In other words, the sensing pixel 122 needs to receive four photons to generate the pixel sensing result. Therefore, the overall sensing sensitivity of the light sensor 100 may be effectively reduced, and the diode 310 of the sensing sub-pixel 300 may be prevented from generating a false sensing signal when the light source 130 does not emit the sensing light beam.

In a fifth calibration means (adapted to the diode 310 operated in the Geiger mode or the avalanche linear mode), in the above step S530, alternatively, the control circuit 110 may control the light source 130 to emit the sensing light beam corresponding to a specific pulse code, and the control circuit 110 may determine whether a sensing signal output by the time-to-digital converter 330 of the sensing sub-pixel 300 corresponds to the specific pulse code to generate a confirmation sensing result. In other words, the control circuit 110 may control the light source 130 to emit the sensing light beam of a specific pulse code or a specific pattern, and determine whether the sensing signal generated by the sensing sub-pixels 121_1-121_N of the sensing array 120 is the sensing result having the corresponding specific pulse code or the specific patter, so as to effectively prevent the light sensor 100 from generating a false sensing signal when the light source 130 does not emit the sensing light beam.

In a sixth calibration means (adapted to the diode 310 operated in the Geiger mode or the avalanche linear mode), in the above step S530, alternatively, the control circuit 110 may adjust a fill factor of the sensing array 120 to calibrate the overall sensing sensitivity of the light sensor 100. The control circuit 110 may decrease the fill factor of the sensing array 120 to accordingly decrease the overall sensing sensitivity of the light sensor 100, so as to effectively prevent the light sensor 100 from generating a false sensing signal when the light source 130 does not emit the sensing light beam. In the embodiment, a way for the control circuit 110 to adjust the fill factor is to disable a part of a plurality of sensing sub-pixels in each of the plurality of macro-pixels of the light sensor 100 during the sensing period, so as to reduce the sensing sensitivity. For example, the control circuit 110 disables Q sub-pixels in P sub-pixels of each of the plurality of macro-pixels of the light sensor 100 during the sensing period, where P and Q are positive integers, and P is greater than Q.

Figure 6A:
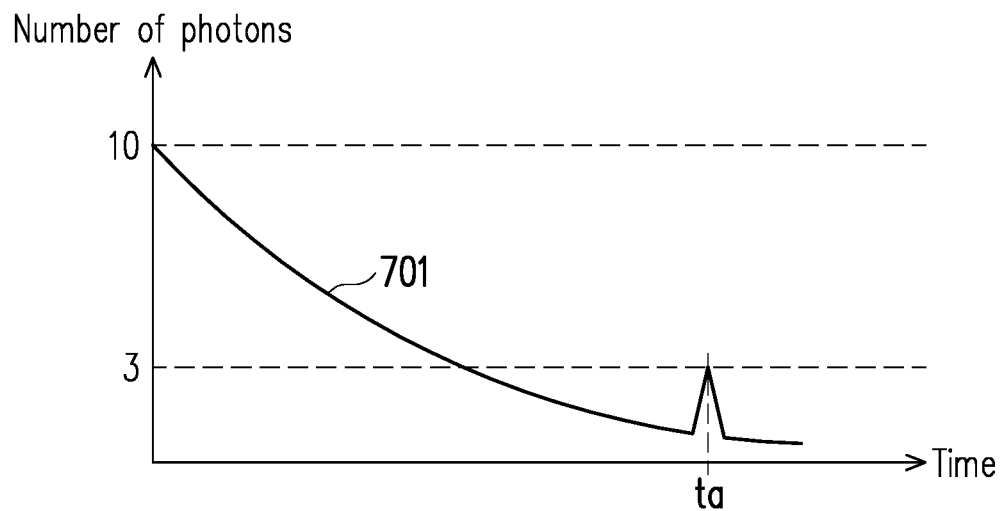
FIG. 6A is a schematic diagram of a signal waveform curve of a sensing signal according to an embodiment of the disclosure.
Figure 6B:
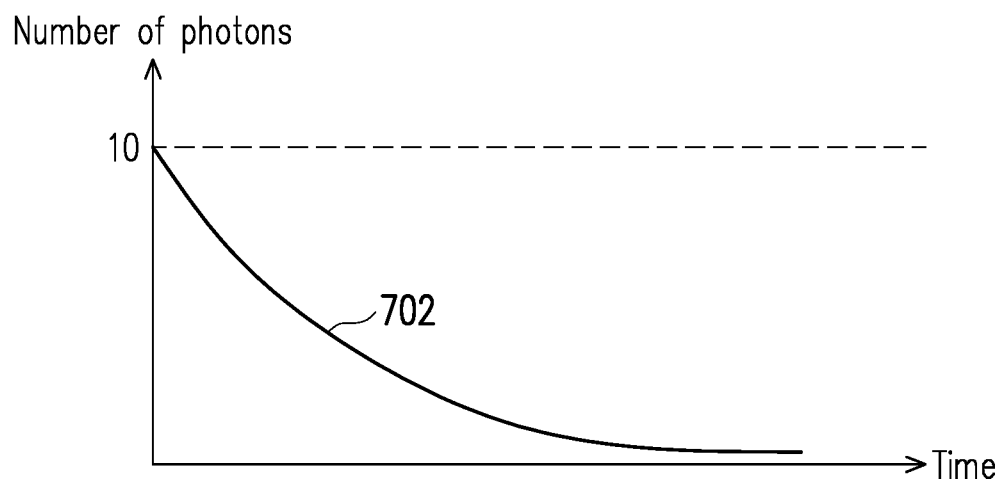
FIG. 6B is a schematic diagram of a reference signal waveform curve according to an embodiment of the disclosure.
Figure 6C:
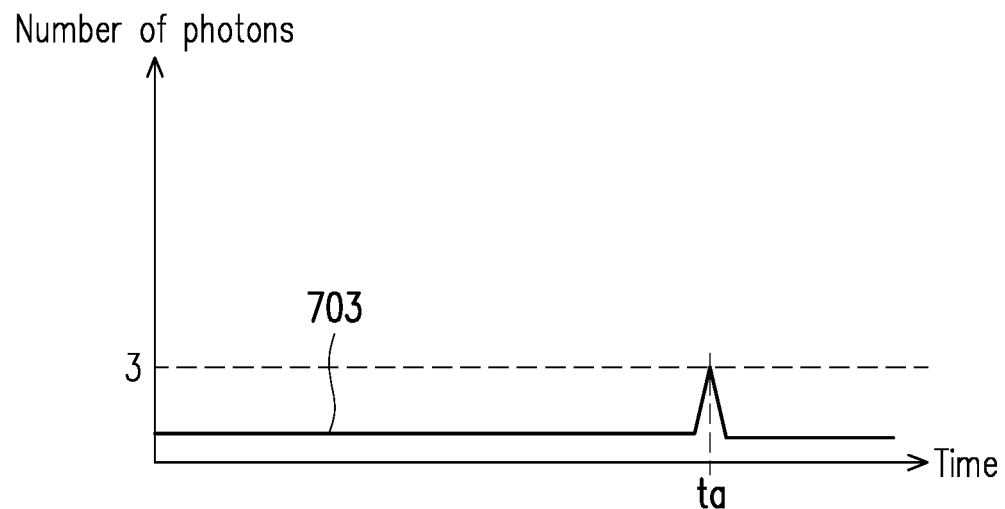
FIG. 6C is a schematic diagram of a calibrated signal waveform curve according to an embodiment of the disclosure.

FIG. 6A is a schematic diagram of a signal waveform curve of a sensing signal according to an embodiment of the disclosure. FIG. 6B is a schematic diagram of a reference signal waveform curve according to an embodiment of the disclosure. FIG. 6C is a schematic diagram of a calibrated signal waveform curve according to an embodiment of the disclosure. With reference to FIG. 1, FIG. 2, and FIG. 6A to FIG. 6C, in the embodiment, the control circuit 110 may correct the sensing signal of each of the sensing sub-pixels 121_1-121_N. When the diodes of the sensing sub-pixels 121_1-121_N are operated in the Geiger mode or the avalanche linear mode, the control circuit 110 may respectively create the signal waveform curve as shown in FIG. 6A according to the sensing signals respectively provided by the plurality of diodes of the sensing sub-pixels 121_1-121_N during the sensing period. It should be noted that the signal waveform curve of the embodiment may also be presented in the form of histogram data.

For example, since the diode is operated in the Geiger mode or the avalanche linear mode, the number of photons corresponding to a time point ta of a signal waveform curve 701 of the sensing signal may have a corresponding sensing result. However, since the diode operated in the Geiger mode or the avalanche linear mode is easily affected by the ambient light or the background light, if the control circuit 110 determines whether the sensing light beam is received according to the sensing result of whether the signal waveform curve 701 exceeds 3 photons, the influence of the ambient light or the background light on the signal waveform curve 701 is higher than or equal to 3 photons (the signal intensity corresponding to the ambient light or the background light, is for example, up to 10 photons). In this regard, the control circuit 110 may create a reference signal waveform curve 702 as shown in FIG. 6B according to another sensing signal provided by each of the plurality of diodes during another sensing period when the light source 130 does not emit the sensing light beam. The control circuit 110 may compare the signal waveform curve 701 of FIG. 6A with the reference signal waveform curve 702 of FIG. 6B. The control circuit 110 may perform numerical subtraction on the signal waveform curve 701 and the reference signal waveform curve 702 to generate a calibrated signal waveform curve 703 as shown in FIG. 6C. Therefore, the control circuit 110 may analyze the signal waveform curve 703 to determine that the signal waveform curve 703 has a curve change of the sensing result higher than or equal to 3 photons at the time point ta to determine that the sensing light beam is received. Therefore, since the sensing sub-pixels 121_1-121_N may respectively perform the above-mentioned signal waveform calibration processing, the light sensor 100 of the embodiment may effectively confirm whether the plurality of diodes respectively sense the sensing light beam emitted by the light source 130.

However, in other embodiments of the disclosure, the control circuit 110 may also deduce the portion corresponding to a background sensing signal in the sensing signal according to a value distribution of each of the plurality of diodes as the signal waveform curve 701, so as to generate the reference signal waveform curve 702. It should be noted that the above deduction adopts a Poisson distribution. To be specific, since the waveform curve of the background sensing signal is the Poisson distribution, the control circuit 110 may deduce the value distribution of the signal waveform curve 701 according to the Poisson distribution to obtain the reference signal waveform curve 702 corresponding to the background sensing signal portion in the sensing signal. Moreover, the control circuit 110 may perform value subtraction on the signal waveform curve 701 and the reference signal waveform curve 702 deduced from the Poisson distribution to obtain the signal waveform curve 703.

Figure 6D:
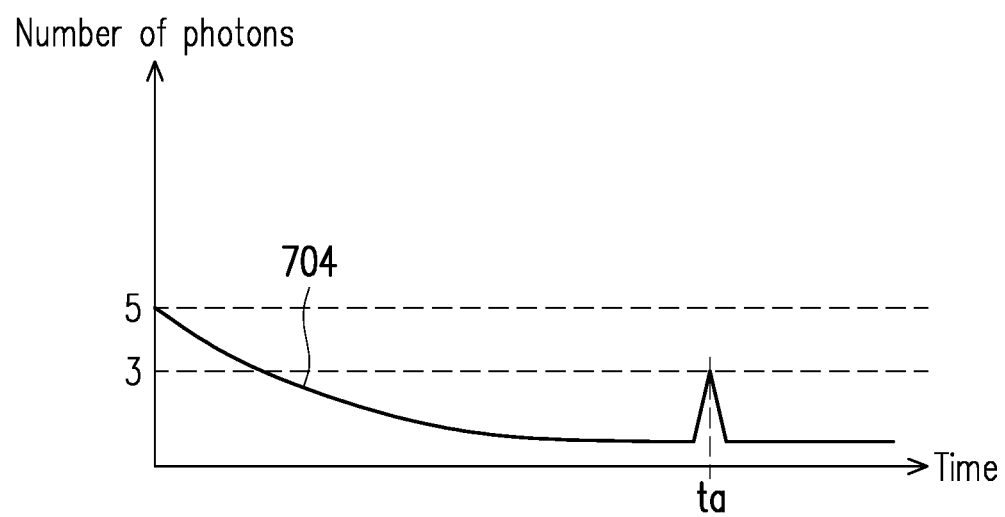
FIG. 6D is a schematic diagram of a signal waveform curve of a sensing signal according to another embodiment of the disclosure.

FIG. 6D is a schematic diagram of a signal waveform curve of a sensing signal according to another embodiment of the disclosure. With reference to FIG. 1, FIG. 2, and FIG. 6D, in other embodiments of the disclosure, the sensing light beam emitted by the light source 130 may have a first polarization (for example, vertical polarization or horizontal polarization). Each of the sensing sub-pixels 121_1-121_N may include a filter with the first polarization, so that the plurality of diodes of the sensing sub-pixels 121_1-121_N may only receive light with the first polarization. Therefore, the control circuit 110 may create a signal waveform curve 704 according to the sensing signals provided by the plurality of diodes of the sensing sub-pixels 121_1-121_N during the sensing period. In this regard, since the ambient light or background light has unpolarized characteristics, the signal intensity corresponding to the sensing result of the background light or the ambient light in the signal waveform curve 704 may be reduced (the signal intensity corresponding to the ambient light or the background light is, for example, 5 photons). In this way, the signal intensity of the portion of the signal waveform curve 704 corresponding to the ambient light or the background light is reduced. In contrast, the signal intensity of the signal waveform curve 704 corresponding to the sensing result at the time point ta is enhanced. Therefore, the signal waveform curve 704 may make it easier for the control circuit 110 to perform signal analysis, and thus may effectively obtain the sensing result at the time point ta.

Figure 7:
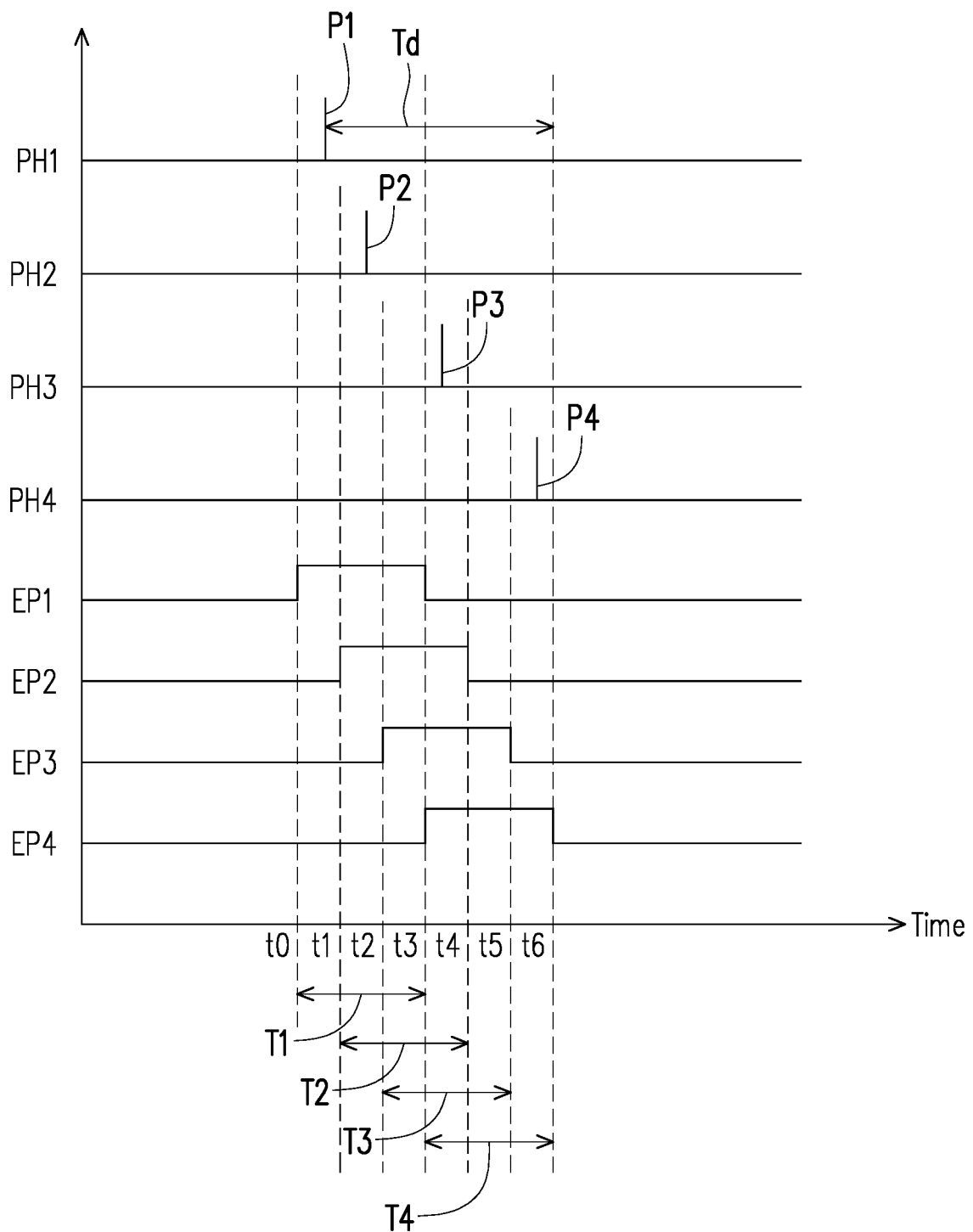
FIG. 7 is an operation timing diagram of a light sensor according to an embodiment of the disclosure.

FIG. 7 is an operation timing diagram of a light sensor according to an embodiment of the disclosure. With reference to FIG. 1, FIG. 2, and FIG. 7, it should be noted that since the plurality of diodes of the sensing sub-pixels 121_1-121_N respectively serve as single-photon avalanche diodes (operated in the Geiger mode or the avalanche linear mode), when the plurality of diodes respectively sense photons to cause avalanche, the sensing sub-pixels 121_1-121_N must respectively re-bias the plurality of diodes, so that there will be a period of time when photons cannot be sensed (which may be referred to as a dead time). In this regard, in order to reduce an influence of the dead time, the control circuit 110 of the embodiment may, for example, set every several sensing sub-pixel in the sensing sub-pixels 121_1-121_N as a sensing pixel. For example, with reference to FIG. 1, the four sensing sub-pixels 121_A-121_D may serve as one sensing pixel 122.

When the four diodes of the sensing sub-pixels 121_A-121_D are operated in the Geiger mode or the avalanche linear mode, the control circuit 110 may sequentially expose the sensing sub-pixels 121_A-121_D belonging to the same pixel during a frame sensing period between a time point t0 and a time point t6. Shown as emission timings PH1-PH4 of the sensing light beam in FIG. 7, during the period from the time point t0 to the time point t6, for example, four sensing light beam signals (photons) P1-P4 are emitted to the sensing pixel 122. Shown as exposure operation timings EP1-EP4 in FIG. 7, when the sensing sub-pixel 121_1 receives the sensing light beam signal P1 at the time point t1 in an exposure period T1, the sensing sub-pixel 121_1 needs to go through a delay time Td before proceeding a next exposure operation. In this regard, if the exposure periods T2-T4 of the sensing sub-pixels 121_2-121_4 are the same as the exposure period T1, the sensing sub-pixels 121_1-121_4 may only receive the sensing light beam signal P1, and the sensing light beam signals P2-P4 will not be sensed due to that the sensing sub-pixels 121_1-121_4 are in the dead time.

Therefore, in the embodiment, an exposure start time of the exposure periods T2-T4 of the sensing sub-pixels 121_2-121_4 may be sequentially delayed to the time points t2-t4, and the sequential two adjacent exposure periods of the exposure periods T1-T4 may be partially overlapped. In this way, the sensing sub-pixel 121_2 may receive the sensing light beam signal P2 between the time point t1 and the time point t2 in the exposure period T2. The sensing sub-pixel 121_3 may receive the sensing light beam signal P3 between the time point t3 and the time point t4 in the exposure period T3. The sensing sub-pixel 121_4 may receive the sensing light beam signal P4 between the time point t5 and the time point t6 in the exposure period T4. Therefore, the sensing sub-pixels 121_2-121_4 may effectively receive all of the sensing light beam signals P1-P4 to provide the accurate sensing result.

To sum up, the light sensor and the calibration method thereof provided in one or more embodiments of the disclosure may effectively calibrate the sensing sub-pixels and/or the sensing array, so that the light sensor may generate the sensing signal only when receiving the sensing light beam emitted by the light source. In addition, the light sensor and the calibration method thereof may also calibrate the signal waveform curve of the sensing signal, so that the calibrated sensing signal may be easily analyzed by the control circuit. In addition, the light sensor and the calibration method thereof provided in one or more embodiments of the disclosure may also effectively reduce the influence of the dead time of the sensing sub-pixels, so as to provide accurate sensing results.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:
1. A light sensor, comprising:
    a light source, configured to emit a sensing light beam;
    a sensing sub-pixel, comprising:
        a diode, having a first terminal coupled to an operation voltage;
        a quenching resistor, coupled between a second terminal of the diode and a ground voltage; and
        a time-to-digital converter, coupled to the second terminal of the diode; and
    a control circuit, coupled to the sensing sub-pixel and configured to calibrate a sensing sensitivity of the sensing sub-pixel according to at least one of a photon detection probability, an internal gain value, and a resistance value of the quenching resistor corresponding to the diode of the sensing sub-pixel, so that the sensing sub-pixel generates a single-photon avalanche diode sensing signal only when receiving the sensing light beam,
    wherein the control circuit further adjusts a co-incidence working number of the sensing sub-pixel and at least one another sensing sub-pixel to correspondingly calibrate an overall sensing sensitivity of the light sensor, wherein the control circuit determines whether a plurality of the diodes of the sensing sub-pixel and the at least one another sensing sub-pixel synchronously generate a plurality of sensing currents in an exposure time interval, so as to confirm whether the diodes of the sensing sub-pixel and the at least one another sensing sub-pixel sense light.

2. The light sensor as claimed in claim 1, wherein the control circuit changes the photon detection probability of the diode of the sensing sub-pixel by adjusting an excess bias voltage of the diode of the sensing sub-pixel operated in a Geiger mode, so as to calibrate the sensing sensitivity of the sensing sub-pixel.

3. The light sensor as claimed in claim 1, wherein the control circuit changes the internal gain value of the diode of the sensing sub-pixel by adjusting an excess bias voltage of the diode of the sensing sub-pixel operated in a Geiger mode or a bias voltage of the diode operated in an avalanche linear mode, so as to calibrate the sensing sensitivity of the sensing sub-pixel.

4. The light sensor as claimed in claim 1, wherein the control circuit controls the light source to emit the sensing light beam corresponding to a specific pulse code, and the control circuit determines whether a sensing signal output by the time-to-digital converter of the sensing sub-pixel corresponds to the specific pulse code to generate a confirmation sensing result.

5. The light sensor as claimed in claim 1, wherein the control circuit disables a part of a plurality of the sensing sub-pixels in each of a plurality of macro-pixels of the light sensor to adjust a fill factor of the sensing sub-pixel and calibrate an overall sensing sensitivity of the light sensor.

6. The light sensor as claimed in claim 1, wherein when the diode of the sensing sub-pixel is operated in the Geiger mode or the avalanche linear mode, the control circuit creates a signal waveform curve according to a sensing signal provided by the sensing sub-pixel during a sensing period, and the control circuit compares the signal waveform curve with a reference signal waveform curve to confirm whether the sensing sub-pixel senses the sensing light beam emitted by the light source.

7. The light sensor as claimed in claim 6, wherein the control circuit deduces a value distribution of the signal waveform curve according to a Poisson distribution to obtain the reference signal waveform curve corresponding to a background sensing signal portion in the sensing signal.

8. The light sensor as claimed in claim 6, wherein the reference signal waveform curve is created by the control circuit according to another sensing signal provided by the diode of another sensing sub-pixel when the light source does not emit the sensing light beam.

9. The light sensor as claimed in claim 1, wherein the sensing light beam emitted by the light source has a first polarization,
wherein a plurality of the diodes have a filter of the first polarization and are configured to receive a reflected light beam corresponding to the sensing light beam.

10. The light sensor as claimed in claim 1, wherein when a plurality of the diodes of the sensing sub-pixel and at least one another sensing sub-pixel belonging to a same pixel are operated in the Geiger mode or the avalanche linear mode, the sensing sub-pixel and the at least one another sensing sub-pixel have exposure periods respectively during a frame sensing period.

11. The light sensor as claimed in claim 10, wherein the exposure periods of the sensing sub-pixel and the at least one another sensing sub-pixel are partially overlapped.

12. A calibration method, adapted to a light sensor, wherein the light sensor comprises a light source, a sensing sub-pixel, and a control circuit, and the sensing sub-pixel comprises a diode, a quenching resistor, and a time-to-digital converter, the calibration method comprising:
turning off the light source through the control circuit;
adjusting a sensing sensitivity of the sensing sub-pixel to a maximum value through the control circuit;
operating the sensing sub-pixel to perform sensing through the control circuit, and determining whether the sensing sub-pixel produces a single-photon avalanche diode sensing signal; and
when the sensing sub-pixel produces the single-photon avalanche diode sensing signal, calibrating the sensing sensitivity of the sensing sub-pixel according to at least one of a photon detection probability, an internal gain value, and a resistance value of the quenching resistor corresponding to the diode of the sensing sub-pixel,
wherein the step of calibrating the sensing sensitivity of the sensing sub-pixel comprises:
adjusting a co-incidence working number of the sensing sub-pixel and at least one another sensing sub-pixel through the control circuit to correspondingly calibrate an overall sensing sensitivity of the light sensor,
wherein the control circuit determines whether a plurality of the diodes of the sensing sub-pixel and the at least one another sensing sub-pixel synchronously generate a plurality of sensing currents in an exposure time interval, so as to confirm whether the diodes of the sensing sub-pixel and the at least one another sensing sub-pixel sense light.

13. The calibration method as claimed in claim 12, wherein the step of calibrating the sensing sensitivity of the sensing sub-pixel comprises:
changing the photon detection probability of the diode of the sensing sub-pixel through the control circuit by adjusting an excess bias voltage of the diode of the sensing sub-pixel operated in a Geiger mode, so as to calibrate the sensing sensitivity of the sensing sub-pixel.

14. The calibration method as claimed in claim 12, wherein the step of calibrating the sensing sensitivity of the sensing sub-pixel comprises:
changing the internal gain value of the diode of the sensing sub-pixel through the control circuit by adjusting an excess bias voltage of the diode of the sensing sub-pixel operated in a Geiger mode or a bias voltage of the diode operated in an avalanche linear mode, so as to calibrate the sensing sensitivity of the sensing sub-pixel.

15. The calibration method as claimed in claim 12, wherein the step of calibrating the sensing sensitivity of the sensing sub-pixel comprises:
controlling the light source to emit the sensing light beam corresponding to a specific pulse code by the control circuit; and
determining whether a sensing signal output by the time-to-digital converter of the sensing sub-pixel corresponds to the specific pulse code through the control circuit to generate a confirmation sensing result.

16. The calibration method as claimed in claim 12, wherein the step of calibrating the sensing sensitivity of the sensing sub-pixel comprises:
disabling a part of a plurality of the sensing sub-pixels in each of a plurality of macro-pixels of the light sensor through the control circuit to adjust a fill factor of the sensing sub-pixel and calibrate an overall sensing sensitivity of the light sensor.

17. The calibration method as claimed in claim 12, further comprising:
   when the diode of the sensing sub-pixel is operated in the Geiger mode or the avalanche linear mode, creating a signal waveform curve through the control circuit according to a sensing signal provided by the sensing sub-pixel during a sensing period; and
   comparing the signal waveform curve with a reference signal waveform curve through the control circuit to confirm whether the sensing sub-pixel senses the sensing light beam emitted by the light source.

18. The calibration method as claimed in claim 12, further comprising:
   when a plurality of the diodes of the sensing sub-pixel and at least one another sensing sub-pixel belonging to a same pixel are operated in the Geiger mode or the avalanche linear mode, operating the sensing sub-pixel and the at least one another sensing sub-pixel through the control circuit to be sequentially exposed during a frame sensing period.

\* \* \* \* \*